United States Patent
McKelvie et al.

(10) Patent No.: US 10,210,085 B2
(45) Date of Patent: Feb. 19, 2019

(54) LEVERAGING NON-VOLATILE MEMORY FOR PERSISTING DATA

(71) Applicant: Amazon Technologies, Inc., Reno, NV (US)

(72) Inventors: Samuel James McKelvie, Seattle, WA (US); Anurag Windlass Gupta, Atherton, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 15/395,582

(22) Filed: Dec. 30, 2016

(65) Prior Publication Data

US 2017/0235675 A1    Aug. 17, 2017

Related U.S. Application Data

(63) Continuation of application No. 13/872,898, filed on Apr. 29, 2013, now Pat. No. 9,535,828.

(51) Int. Cl.

| | | |
|---|---|---|
| *G06F 12/0804* | (2016.01) | |
| *G06F 12/02* | (2006.01) | |
| *G06F 3/06* | (2006.01) | |
| *G06F 12/0868* | (2016.01) | |
| *G06F 9/4401* | (2018.01) | |

(Continued)

(52) U.S. Cl.
CPC ............ *G06F 12/0804* (2013.01); *G06F 1/30* (2013.01); *G06F 3/0625* (2013.01); *G06F 9/4401* (2013.01); *G06F 11/1446* (2013.01); *G06F 12/0238* (2013.01); *G06F 12/0246* (2013.01); *G06F 12/0868* (2013.01); *G06F 1/324* (2013.01); *G06F 1/3275* (2013.01);

(Continued)

(58) Field of Classification Search
CPC ...... G06F 1/324; G06F 1/3275; G06F 3/0625; G11C 11/4072; G11C 2207/2227; G11C 5/14; G11C 5/148
USPC ......................................................... 711/103
See application file for complete search history.

(56) References Cited

U.S. PATENT DOCUMENTS

| | | | | |
|---|---|---|---|---|
| 4,608,632 A | * | 8/1986 | Kummer | ............. G06F 12/0653 345/567 |
| 7,215,574 B2 | * | 5/2007 | Khalid | ............... G11C 16/0483 365/185.12 |

(Continued)

OTHER PUBLICATIONS

"Non Final Office Acted dated Aug. 14, 2015" received in U.S. Appl. No. 13/872,898.

(Continued)

*Primary Examiner* — Mardochee Chery
(74) *Attorney, Agent, or Firm* — Hogan Lovells US LLP

(57) ABSTRACT

Data temporarily stored in volatile memory (e.g., RAM) on a host machine can be protected using a component such as an NV-DIMM, which includes components such as an ASIC, non-volatile memory, and a battery. If power is lost to the host, the battery provides the ASIC with the power needed to determine data in the volatile memory that is protected. This protected data then can be transferred to the non-volatile memory on the NV-DIMM. When power is restored, an application or other entity can contact the NV-DIMM to recover the data, which can be transferred over a sideband channel to be restored as appropriate for a prior operation. In at least some embodiments, the NV-DIMM can receive a key over the sideband channel that can be used to encrypt and decrypt the data for further security.

20 Claims, 6 Drawing Sheets

(51) Int. Cl.
  *G06F 11/14*   (2006.01)
  *G06F 1/30*    (2006.01)
  *G11C 11/4072* (2006.01)
  *G11C 5/14*    (2006.01)
(52) U.S. Cl.
  CPC ............... *G06F 2212/1032* (2013.01); *G06F 2212/205* (2013.01); *G06F 2212/463* (2013.01); *G06F 2212/466* (2013.01); *G11C 5/148* (2013.01); *G11C 11/4072* (2013.01); *G11C 2207/2227* (2013.01)

(56) References Cited

U.S. PATENT DOCUMENTS

| | | |
|---|---|---|
| 8,250,350 B2 | 8/2012 | John |
| 2007/0294496 A1 | 12/2007 | Goss |
| 2009/0316487 A1* | 12/2009 | Lee ............... G11C 11/5628 365/185.22 |
| 2010/0106886 A1* | 4/2010 | Marcu ............ G06F 1/3225 711/102 |
| 2010/0162038 A1 | 6/2010 | Hulbert |
| 2011/0225353 A1* | 9/2011 | Elliott .......... G06F 12/0804 711/103 |
| 2011/0289263 A1 | 11/2011 | McWilliams et al. |
| 2014/0258588 A1 | 9/2014 | Tomlin |

OTHER PUBLICATIONS

"Final Office Acted dated Mar. 29, 2016" received in U.S. Appl. No. 13/872,898.
"Notice of Allowance dated Sep. 12, 2016" received in U.S. Appl. No. 13/872,898.

* cited by examiner

LEVERAGING NON-VOLATILE MEMORY FOR PERSISTING DATA

CROSS-REFERENCES TO RELATED APPLICATIONS

This application is a continuation of allowed U.S. application Ser. No. 13/872,898, entitled "LEVERAGING NON-VOLATILE MEMORY FOR PERSISTING DATA," filed Apr. 29, 2013; of which the full disclosure of this application is incorporated herein by reference for all purposes.

BACKGROUND

As an increasing number of applications and services are being made available over networks such as the Internet, an increasing number of content, application, and/or service providers are turning to technologies such as resource sharing or "cloud computing." Cloud computing, in general, is an approach to providing access to electronic resources through services, such as Web services, where the hardware and/or software used to support those services is dynamically scalable to meet the needs of the services at any given time. A user or customer can obtain access to various services through the cloud, or across at least one network, and thus does not have to purchase and maintain the hardware associated with the services.

In many instances, a customer will provide data to be stored to persistent storage, or at least to be processed using one of the resources. In many instances this can result in the data being at least temporarily stored in volatile memory, meaning that the data can be lost in the event of a power failure or other such event. While there are ways to attempt to protect this data, the restore process generally lacks the logic needed to perform an intelligent operation with the data and prevent the data from being overwritten or otherwise compromised after being restored.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure overcome one or more of the above-referenced and other deficiencies in conventional approaches to protecting data in an electronic environment. In particular, various embodiments utilize a non-volatile in-line memory module (NV-DIMM) or other such memory subsystem that is capable of being installed in a host device without modification of portions of the host, such as the motherboard, BIOS, operating system, etc. The NV-DIMM can include circuitry and/or components, such as at least one ASIC, capable of determining data stored in volatile memory on the host and causing that data to be transferred to non-volatile memory on the NV-DIMM. The NV-DIMM can include a battery (or any other appropriate secondary power source on, or connected to, the NV-DIMM) with sufficient power for the ASIC to perform operations such as to identify one or more protected pages of memory, and cause data in those protected pages to be transferred to non-volatile memory. The NV-DIMM can include a sideband channel that enables an application, entity, service, or component to call into the NV-DIMM to recover the data, independent of a main processor or primary components of the host. The data then can be recovered in an intelligent manner, instead of merely restoring the data to its previous location, which could then be susceptible to being overwritten or obtained by unauthorized entities.

In at least some embodiments the NV-DIMM can obtain a key (or other secret) over the sideband channel that can be used to encrypt the backed up data stored in non-volatile memory on the NV-DIMM. The key will be stored in volatile memory on the NV-DIMM, such that when the NV-DIMM finally loses power (including battery power) the key will no longer be stored on the NV-DIMM. Such an approach protects the backed up data, as the data will still be encrypted even if the NV-DIMM is removed from the host, since the NV-DIMM will no longer contain a copy of the key. When power is restored, the NV-DIMM can receive another copy of the key for use in decrypting the data.

Various other applications, processes, and uses are presented below with respect to the various embodiments.

Figure 1:
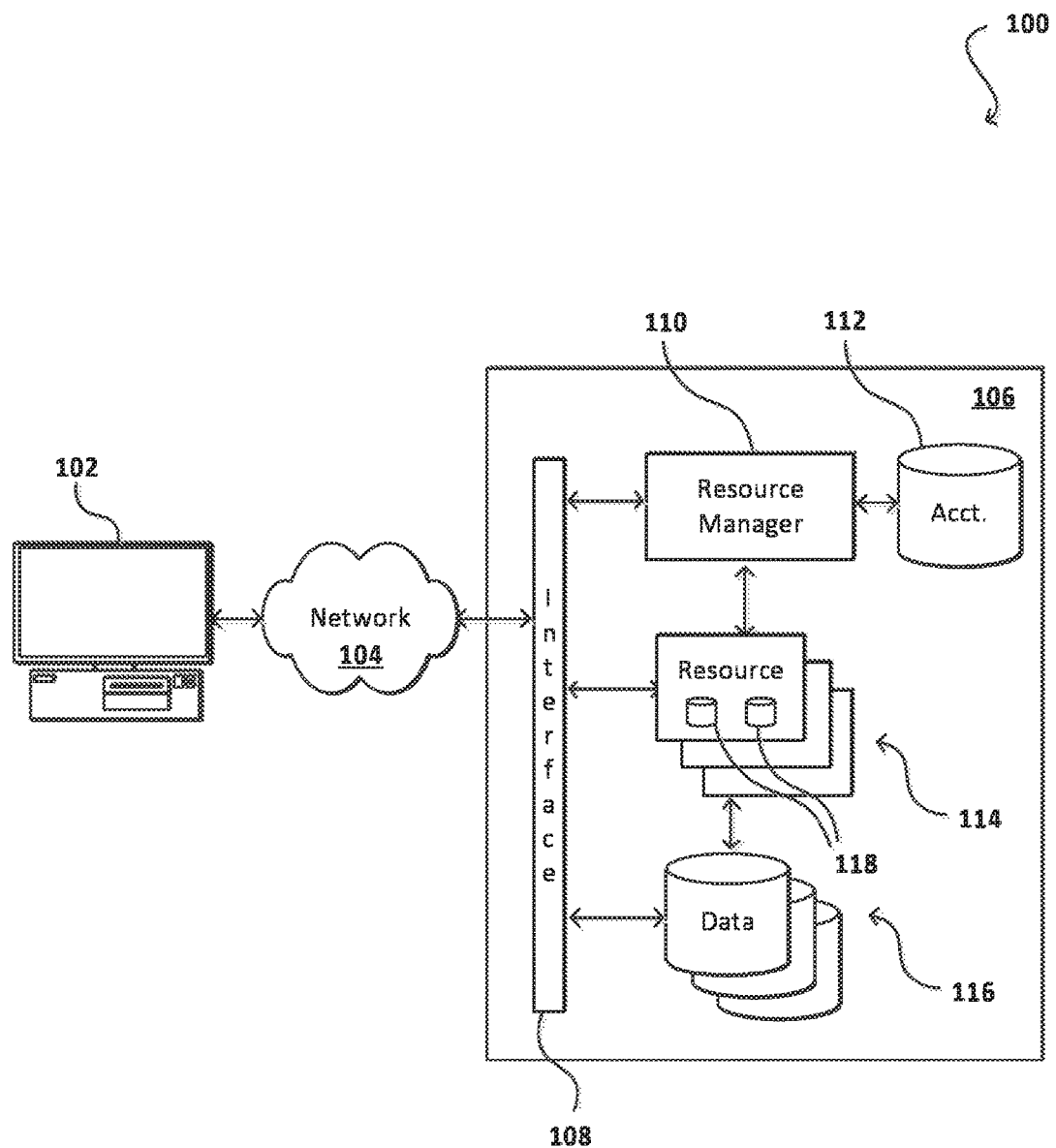
FIG. 1 illustrates an example environment in which various aspects can be implemented.

FIG. 1 illustrates an example environment 100 in which aspects of the various embodiments can be implemented. In this example a user is able to utilize a client device 102 to communicate across at least one network 104 with a resource provider environment 106. The client device can include any appropriate electronic device operable to send and receive requests, messages, or other such information over an appropriate network and convey information back to a user of the device. Examples of such client devices include personal computers, tablet computers, smart phones, notebook computers, and the like. The network(s) 104 can include any appropriate network, including an intranet, the Internet, a cellular network, a local area network (LAN), or any other such network or combination, and communication over the network can be enabled via wired and/or wireless connections. The resource provider environment 106 can include any appropriate components for receiving requests and returning information or performing actions in response to those requests. As an example, the provider environment might include Web servers and/or application servers for receiving and processing requests, then returning data, Web pages, video, audio, or other such content or information in response to the request.

In various embodiments, the provider environment may include various types of resources that can be utilized by multiple users or applications for a variety of different purposes. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example, the provider environment includes a plurality of resources 114 of one or more types. These types can include, for example, application servers operable to process instructions provided by a user or database servers operable to process data stored in one or more data stores 116 in response to a user request. As known for such purposes, the user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, an application executing on the client device 102 that needs to access or utilize a portion of the resources 114, which might be exposed as one or more services to which the application has subscribed, can submit a request that is received to an interface layer 108 of the provider environment 106. The interface layer can include application programming interfaces (APIs) or other exposed interfaces enabling a user to submit requests, such as Web service requests, to the provider environment. The interface layer 108 in this example can also include other components as well, such as at least one Web server, routing components, load balancers, and the like. When a request to access a resource is received at the interface layer 108 in some embodiments, information for the request can be directed to a resource manager 110 or other such system, service, or component configured to manage user accounts and information, resource provisioning and usage, and other such aspects. A resource manager 110 receiving the request can perform tasks such as to authenticate an identity of the user submitting the request, as well as to determine whether that user has an existing account with the resource provider, where the account data may be stored in at least one data store 112 in the provider environment.

An interface layer 108 in at least one embodiment includes a scalable set of customer-facing servers that can provide the various APIs and return the appropriate responses based on the API specifications. The interface layer also can include at least one API service layer that in one embodiment consists of stateless, replicated servers which process the externally-facing customer APIs. The interface layer can be responsible for Web service front end features such as authenticating customers based on credentials, authorizing the customer, throttling customer requests to the API servers, validating user input, and marshaling or un-marshaling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, customers of the control service. The servers of the Web services layer can be stateless and scaled horizontally as known in the art. API servers, as well as the persistent data store, can be spread across multiple data centers in a region, for example, such that the servers are resilient to single data center failures.

Each resource 114 can include a number of different components that can be used for a variety of purposes. For example, a resource can be a host machine that includes various types of storage 118, such as random access memory, flash memory, disk drives, and the like. When the resource is being utilized by a user, for example, the resource might have various information stored in RAM for performing one or more operations, and might also persistently store information to one or more persistent data storage devices, such as disk drives or flash memory that can be located on the resource 114 or remote from the resource, such as in a remote data store 116. Problems can arise, however, when power is lost to the resource or another such failure occurs. If information for the user is stored in volatile memory, or is in the process of being written to persistent storage, that data can potentially be lost as a result of the failure.

Figure 2:
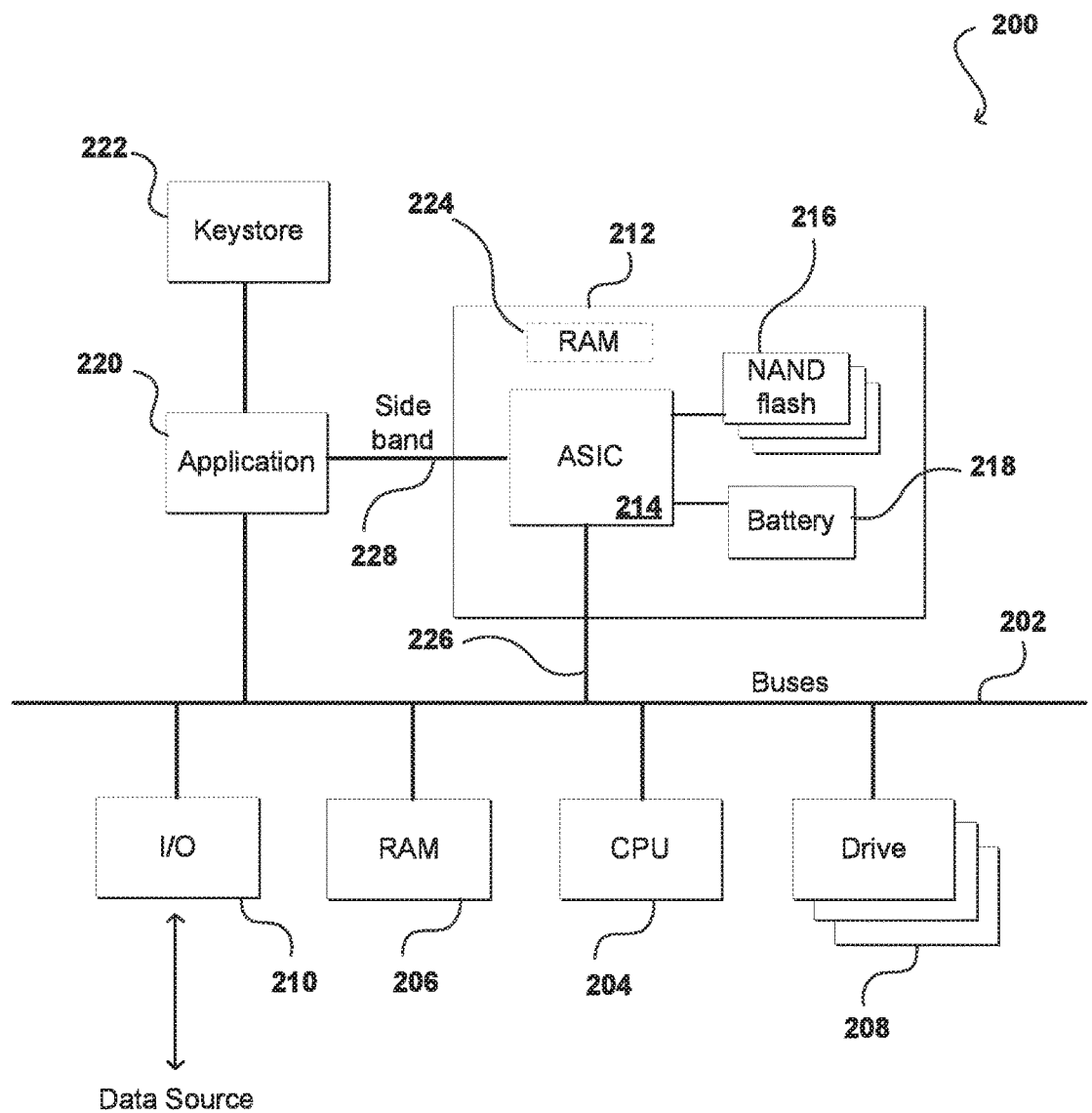
FIG. 2 illustrates an example set of components for backing up data that can be utilized in accordance with the various embodiments.

Accordingly, approaches in accordance with various embodiments attempt to backup important data in the event of a power failure or other such event, such that the data can be available upon recovery from the failure. As an example, FIG. 2 illustrates an example configuration 200 of components that can be utilized in a resource such as a host machine. In this example, the host has components including at least one central processing unit (CPU) 204 and volatile memory, such as random access memory (RAM) 206, connected via one or more buses 202, as may include one or more control buses, memory buses, address buses, data buses, system buses, and the like. The buses 202 may also connect various other components as well, as may include one or more hard drives 208 or persistent storage devices, as well as one or more input/output (I/O) components 210, as may interface with one or more data sources to transfer data to and/or from the data source. Various other components can be connected as well as part of a host machine, as is known for such purposes.

In one embodiment, a data source might attempt to write data to persistent storage, such as a drive 208 on the host machine. The data source can submit a request with data that is received by an I/O component 210 and then temporarily stored in memory, such as RAM 206, until the data can be persistently stored to the determined drive(s) 208. Information about the operation to be performed also can be stored in RAM. As discussed, however, the data in RAM can be lost in the event of a power failure or other such event.

Accordingly, approaches in accordance with various embodiments can take advantage of a component such as a non-volatile in-line memory module (NV-DIMM) 212, or other such non-volatile module, to attempt to prevent the loss of at least some of the data stored in RAM or other volatile memory, which requires power to maintain the stored information. A module such as an NV-DIMM 212 can be inserted in place of a conventional DIMM or other system RAM on a motherboard of the host. The NV-DIMM has an application-specific integrated circuit (ASIC) 214, or other such component and/or circuitry, that is customized to manage the storage of information stored in RAM 206 or other volatile memory on the host. The NV-DIMM 212 includes one or more non-volatile memory components 216, such as flash memory or NAND devices, and one or more batteries 218, such as a supercap battery, that can provide a limited amount of power to the ASIC in the event of a power failure of the host device. In the event of a power failure, for example, the ASIC 214 can take control of the memory bus and copy the contents of volatile memory 206 to non-volatile memory 216, up to the capacity of the non-volatile memory and/or the battery life of the battery 218. In at least some embodiments the NV-DIMM 212 can also include volatile memory 224, at least a portion of the contents of which can also be written to non-volatile memory in at least some situations.

A conventional NV-DIMM can transfer data from RAM 206 into flash memory 216, and then upon reboot of the host can cause that data to be written back to its original location for purposes of finishing a write operation or another such action. There can be various disadvantages to such an approach, however. For example, it might be undesirable to write data back to its original location as the data might be overwritten by the OS. Further, restoring data can potentially expose the data to parties that were not intended to be able to access the data. Various other issues with blindly restoring the data can arise as well.

Accordingly, approaches in accordance with various embodiments provide some additional intelligence or logic in the ASIC to enable aspects such as the timing, amount, and type data backup to be controlled. Further, a sideband channel 228 or backchannel can be used to enable the data written to non-volatile memory 216 to be recovered and managed in an intelligent way, rather than just restoring the data to its previous location(s).

For example, a request might be received from a data source to write data to a drive 208 on, or in connection with, the host machine. As part of the writing process, the host machine might receive the data via an I/O component 210 and at least temporarily store data in RAM 206 on the host. With conventional components, data typically is capable of being received and written to volatile memory faster than the data can be written to persistent storage, such as a disk drive. Thus, received data can be cached or buffered in RAM until such time as the data is able to be written to disk. The RAM might also temporarily store other types of data as well, such as information for the operating system (OS) or other operations on the host. It might be desired to prevent loss of the data received from the data source, but it might not matter whether some or all of the other types of data are recoverable. If there is sufficient non-volatile memory and battery power on the host, all data in volatile memory can be backed up in the event of a power failure of the host, without concern over which types of data are included. It will often be the case, however, that there is less non-volatile memory than volatile memory on a device, based at least in part upon the relative cost of the different types of memory and the need for corresponding amounts of each type of memory for conventional activities.

Accordingly, it can be desirable to attempt to determine which type of data should be transferred to non-volatile storage by an NV-DIMM in the event of a power failure. In some embodiments, the ASIC can leverage a protocol that enables specific pages of RAM memory to be mapped to the non-volatile memory of the NV-DIMM. Depending at least in part upon the amount of non-volatile memory, the mapping can include a subset of the entire set of RAM. The mapping can take the form of a bitmap of pages to protect, a translation list of addresses from RAM to addresses on flash, etc. When the power is lost to the host, the ASIC can determine the appropriate memory pages to be protected, and can cause data from those pages to be stored in non-volatile memory on the DIMM. Further, in at least some embodiments the backing up of data might not occur instantly, but might wait until such time as the ASIC has been able to determine the appropriate data and/or performed any related actions, then can back-up the data as appropriate (assuming sufficient remaining battery life). In some embodiments, the ASIC can determine remaining battery life and determine when to backup data based at least in part upon the remaining battery life.

The NV-DIMM 212 in this example also has a sideband channel 228 that can enable access to the data stored in the non-volatile memory 216. The sideband channel can allow an application 220 or designated component to access the stored data without automatically restoring the data to its previous location. In this example, the application upon a restart or reboot can determine that there was a reboot, for example, and can reach out to the ASIC 214 over the sideband channel 228 to determine whether data was stored in response to a failure. The application 220 can also read related data, such as metadata or log information, stored with the data that enables the application to determine one or more actions to perform with respect to the data. Such an approach enables the data to be restored and/or utilized intelligently, rather than just restoring to RAM, which could potentially result in the data being lost or overwritten by an operating system or other such entity or component. As an example, the application can determine that a portion of the data was being written to disk, and can trigger a resume or similar operation to have the remaining data written to disk and associated with the previously written portion. Similarly, if an operation was being performed using that data, the application can provide that data with instructions for completing the operation. In some embodiments, a portion of the data might be written back to specific memory pages of RAM that are mapped to the non-volatile memory of the NV-DIMM. Various other uses or applications can be determined as well within the scope of the various embodiments.

In some embodiments, the sideband channel 228 can be used to provide instructions or configuration information to the ASIC. For example, a control plane component (not shown) could send instructions to the ASIC regarding how to process certain data, and when to perform the processing, in response to a failure. Similarly, an application could communicate with the ASIC to indicate types of memory to be backed up, memory pages to be mapped, or other such information. The use of the sideband channel prevents this information from being accessible to a central processor of the host, which in a shared and/or multi-tenant environment can prevent other users from being able to access the instructions and/or data. The ability to control aspects of the ASIC over the sideband channel means that the NV-DIMM and associated functionality can be utilized without changes to the motherboard, OS, and/or BIOS in at least some embodiments. Further, the NV-DIMM can be accessed via conventional approaches, such as by using a driver or API to access the data stored on the NV-DIMM. In at least some embodiments, however, a separate API can be utilized to map the physical memory pages that are to be backed up to the NV-DIMM. Further, since the NV-DIMM operates independent of the state of the entire system, there is no need to worry about maintaining a state of other onboard devices of the host.

In order to further protect the backed up data, approaches in accordance with various embodiments can also utilize key-based encryption or other such security mechanisms. For example, a keystore 222 can generate, provide, and/or store a copy of one or more keys, or other such secrets, that can be used to encrypt or protect information stored in non-volatile storage on the NV-DIMM 212. For example, an application 220 or other such entity or component can communicate with the keystore to cause the key to be provided to the ASIC 214 over the sideband channel 228. Providing the key over the sideband channel, which may not be visible and/or accessible to the main host CPU or other such components as discussed elsewhere herein, prevents the key from being intercepted by another user, application, or component provisioned on, installed in, or accessible to the host. The key can be obtained by the ASIC at each startup, for example, as well as in response to a key rotation or other such action. When data is written to the non-volatile memory by the ASIC, the ASIC can cause the data to be encrypted with the key. The key can be stored in volatile memory 212 on the NV-DIMM, such that the data is protected even in the event that someone takes the physical NV-DIMM out of the machine, as the key will be lost once power to the NV-DIMM is lost. The key can only be obtained, and the data decrypted, when the NV-DIMM is installed in the host and able to obtain the key from the keystore at startup or another determined action or event. The key can be any appropriate secret useful to protect data, and the keystore can be any appropriate system or service, on the host or elsewhere, capable of providing a key and securely storing a copy of that key.

A sideband channel, such as those discussed above, can take any of a number of different forms, as may be appropriate for the particular embodiment. For example, in addition to operating like standard NV-RAM (e.g., performing read and write operations on the RAM), the NV-RAM can be implemented to function like a control register that is mapped into main memory of the host computing device, providing mapped and accessible I/O space on the device to access the non-volatile portion of the device. For example, the NV-RAM can have one or more APIs, or other such interfaces, that enable the reading and writing of data to the non-volatile portion of the NV-RAM in addition to the standard interfaces used to read and write to the volatile memory of the device. The NV-RAM thus can appear to the OS as a storage component like a PCI device, but can have at least one secondary interface that functions as the sideband channel. An OS, application, driver, or other such entity or component then can read the persisted data from the NV-RAM using the sideband channel, assuming proper authentication or other such granted access. In one example, an application can communicate with a driver that has been authenticated to the NV-RAM and has access to the mapping of various memory ranges, such that the application can access the requested data via the driver. Similarly, a control plane or management component can utilize such a driver to place or update a key stored in the NV-RAM and used to encrypt the data to be persisted.

In at least some embodiments, an application or other such component or entity can access less than all the persisted data at various times. For example, there might be 30 GB of data persisted in the NV-RAM. It can be undesirable, in at least some embodiments, to have to read all the persisted data out of NV-RAM at once, as such a process can require around 30 GB of memory (or other such storage) to hold that data until it is processed. Approaches in accordance with various embodiments enable portions or "chunks" of the persisted data to be read at various times, which can help to reduce and/or minimize the amount of device memory that is needed to access the persisted data. The NV-RAM thus can function more like a traditional disk drive, wherein portions of the data can be requested and/or accessed as appropriate.

Further, the driver can actually mount the NV-RAM as a storage device in the operating system in at least some embodiments. Such an implementation enables access as if the NV-RAM is a drive or other such storage device. The NV-RAM can be visible to all entities having access to the host device, or only those authorized to access the NV-RAM. In some embodiments, the NV-RAM might only be visible when there is persisted data that has not yet been read out of the NV-RAM. Various other visibility options can be utilized as well. As mentioned, an authorization process might be used to grant access to data persisted in the NV-RAM. In other embodiments the encryption of the data will be used to protect the data from unauthorized parties, as those parties will not have the appropriate decryption key.

Another advantage of being able to backup important data is that commits can be relayed to a user at the rate of DRAM, for example, instead of the write rate of a hard disk, solid state drive (SSD), or other such persistent storage device. For example, a user requesting to persistently store a data file can have that data written to RAM on the host before the data is written to disk. If that portion of RAM is able to be guaranteed to be recoverable in the event of a failure, as the data can be written to the NV-DIMM, a confirmation of the storage can be provided to the user even though the data has not yet been committed to disk. In the event of a failure, the remaining data can be backed up to the NV-DIMM, and then upon reboot the data can be recovered from the NV-DIMM and the writing to disk completed. A corresponding application can talk to the NV-DIMM through an appropriate driver, for example, to configure the ASIC to protect a corresponding portion of the pages of RAM. Each time a request to write data to a drive is received, for example, information for the write can be recorded as a journal entry into one of the protected pages mapped to the NV-DIMM. At least one of the pages then can be designated a log for writes being performed on the host. As soon as the data is written into the NV-DIMM protected pages of memory, the network request can be acknowledged and the client notified that the write was completed.

Figure 3:
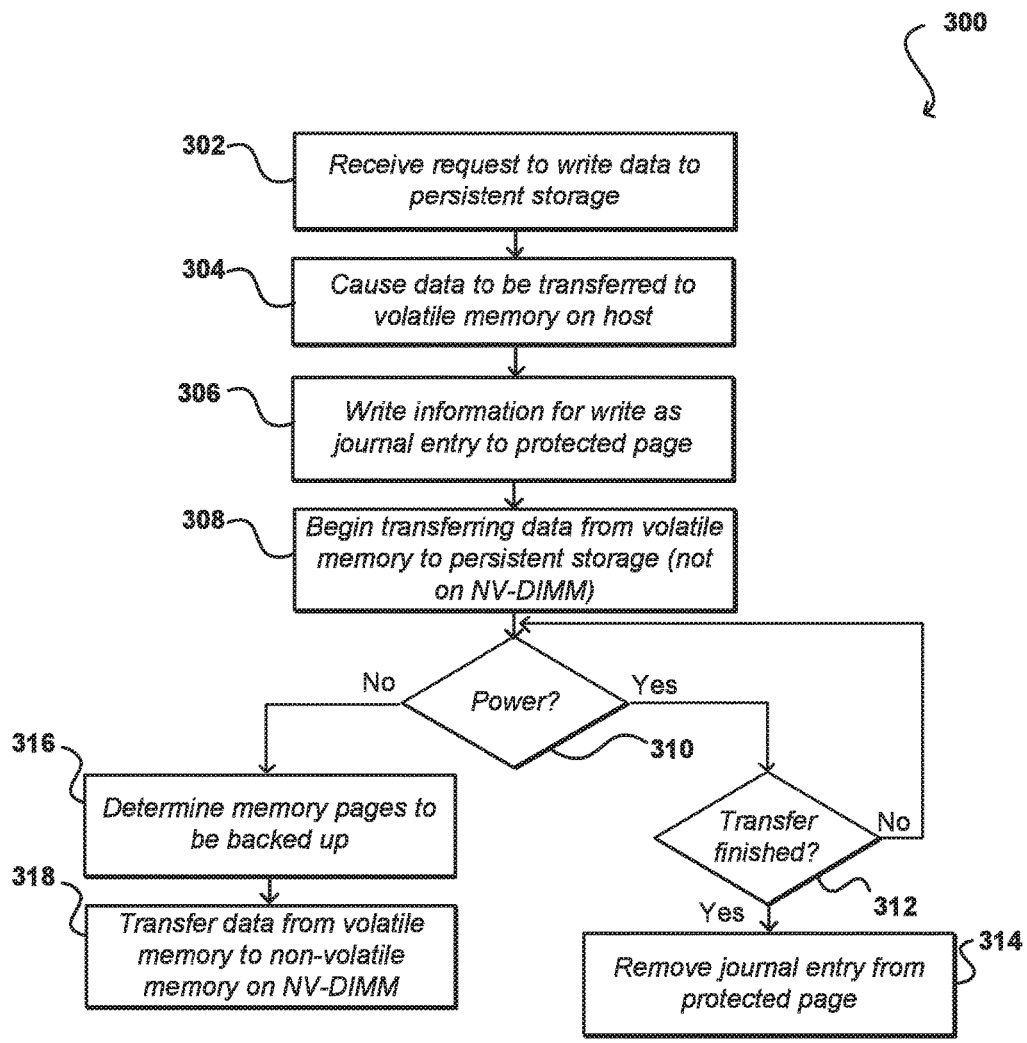
FIG. 3 illustrates an example process for protecting data in response to a power failure that can be utilized in accordance with the various embodiments.

FIG. 3 illustrates an example process 300 for backing up data in volatile memory to non-volatile memory in the event of a failure that can be utilized in accordance with various embodiments. It should be understood that there can be additional, fewer, or alternative steps performed in similar or alternative orders, or in parallel, within the scope of the various embodiments unless otherwise stated. In this example, an instruction or request to write data to persistent storage is received 302. Aspects of this and other processes discussed herein can be implemented through software, circuitry, or combinations thereof. In response, an application or process can cause 304 the data to be transferred to volatile memory (e.g., DRAM) on the host, and information for the write operation can be written 306 as a journal entry to a memory page of the volatile memory that is mapped to an NV-DIMM or other such component on the host. At least a portion of the data received to the volatile memory can be transferred 308 to the persistent storage (e.g., a hard disk or SSD separate from the NV-DIMM). If power to at least a relevant portion of the host device is detected to no longer be present 310, an ASIC or other component of the NV-DIMM can determine 316 memory pages to be backed up to non-volatile memory (e.g., NVRAM or NAND memory) on the NV-DIMM, and can cause that data to be transferred 318 from volatile memory to non-volatile memory on the NV-DIMM. As long as power remains, the process can continue until it is determined 312 that the write to persistent storage (or other such transfer or operation as discussed elsewhere herein) has finished, at which time the journal entry in the protected memory page can be deleted 314. As discussed, in different embodiments the write can be acknowledged when all data is written to persistent storage or when all data has at least been written to a protected memory page.

Figure 4:
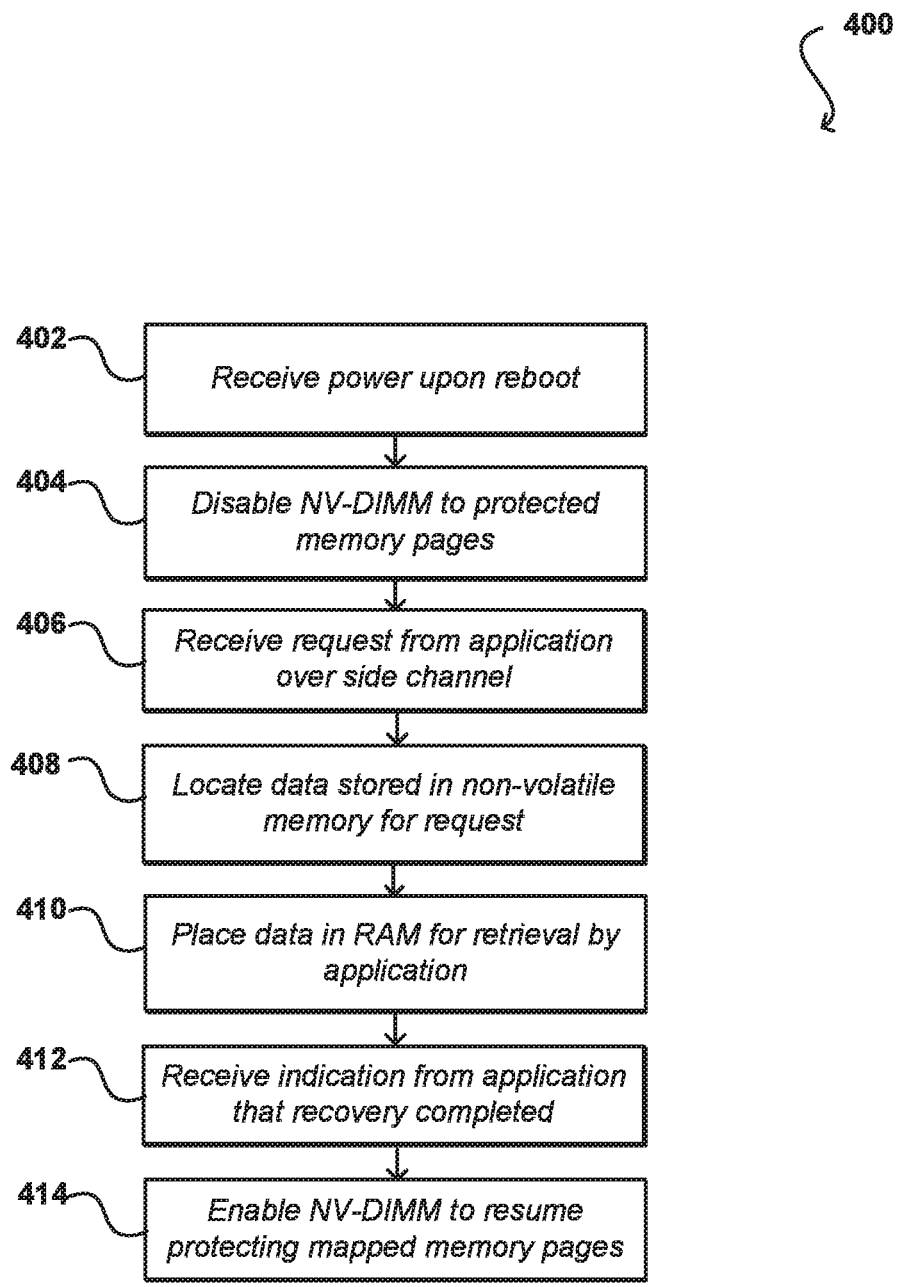
FIG. 4 illustrates an example process for restoring data that has been protected in response to a power failure that can be utilized in accordance with various embodiments.

FIG. 4 illustrates an example process 400 for recovering data protected by an NV-DIMM upon reboot that can be utilized in accordance with various embodiments. In this example, power is received 402 to a host and installed NV-DIMM after a power failure that resulted in designated data being transferred to non-volatile memory on the NV-DIMM. At boot time, the ability of data be restored from the NV-DIMM to the protected memory pages, or otherwise utilized as in conventional approaches, is disabled 404. A request is received 406 to the NV-DIMM over a sideband channel from an application, or other such entity or component, relating to at least some of the data that was backed up in response to the power failure. The data corresponding to the request can be located 408 in the non-volatile memory, and the data can be placed 410 in RAM, or another appropriate location, for retrieval by the application, enabling any previous operation involving the data to resume. Once an indication is received 412 from the application that the data recovery has completed, the NV-DIMM can be enabled 414 to resume protecting the protected memory pages. In some embodiments, the NV-DIMM can store the data until instructed by the application to delete the backup copy.

Figure 5:
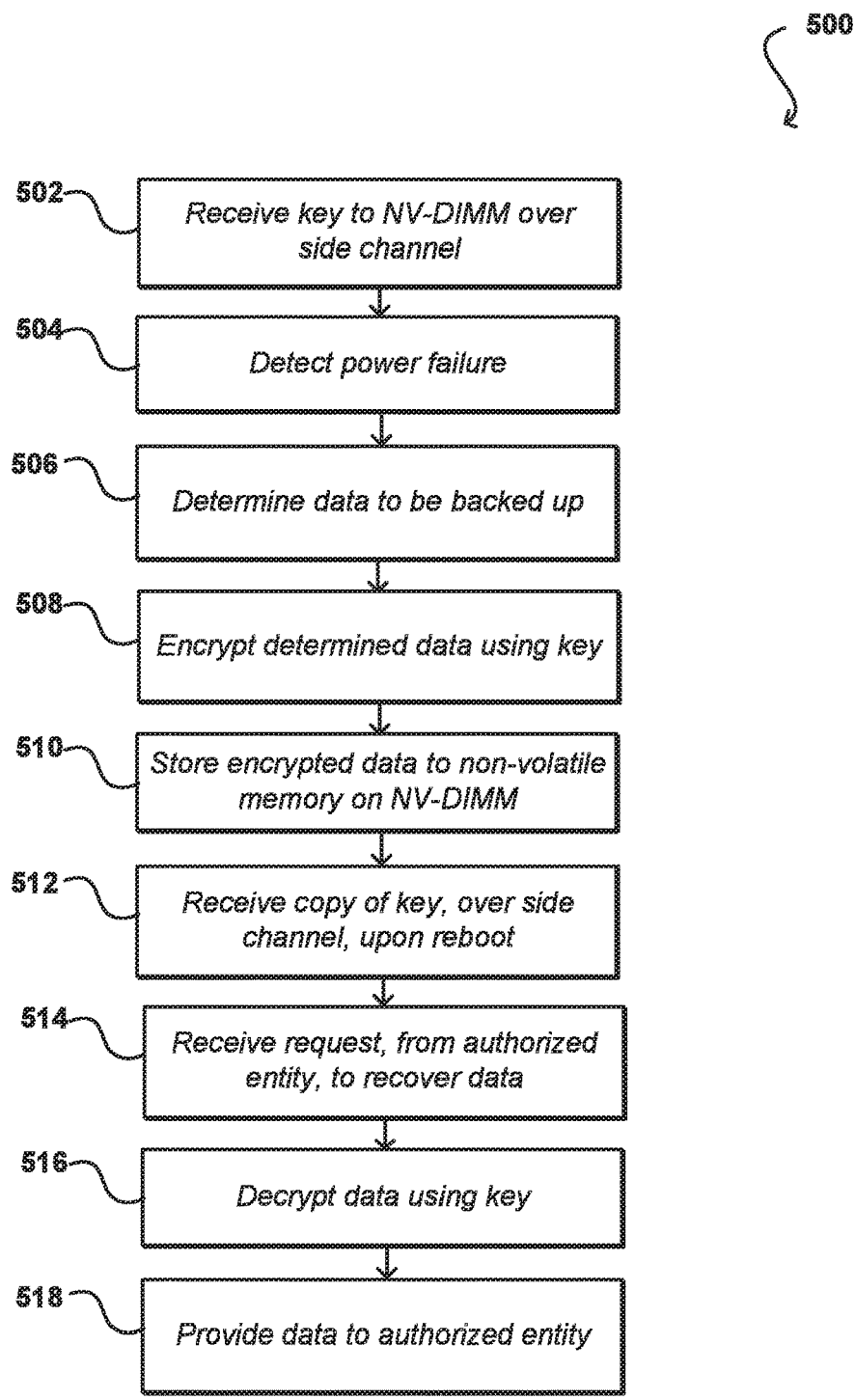
FIG. 5 illustrates an example process for securely protecting data in response to a power failure that can be utilized in accordance with various embodiments.

FIG. 5 illustrates a similar example process 500 to that of at least a portion of FIGS. 3 and 4, except that in this example the backed up data is encrypted with a key in accordance with various embodiments. In this example, a key (or other such secret) is received 502 to the NV-DIMM over a side channel, which can be inaccessible to a host processor or guest instance in at least some embodiments. At some point the NV-DIMM can detect 504 a power failure with respect to the host machine in which the NV-DIMM is installed. In response, an ASIC of the NV-DIMM can determine 506 the data to be backed up, such as by examining journal entries in one or more protected pages, and cause that data to be received and encrypted 508 using the key on the NV-DIMM. The encrypted data can be stored 510 in non-volatile memory on the NV-DIMM. When battery power for the NV-DIMM runs out, the NV-DIMM will no longer store a copy of the key, such that the data will not be able to be decrypted even if the NV-DIMM is taken out of the host machine for obtaining the data. The NV-DIMM then can receive 512 another copy of the key upon reboot. Again, the key can be received from an application over the side channel. When a request is received 514, over the side channel or through a driver or API, from an authorized entity to obtain or recover the data, the data can be decrypted 516 using the key. The decryption can be performed in at least some embodiments upon verifying an identity of the authorized entity or performing another such security operation. The decrypted data then can be provided 518 to the authorized entity. The backed up data and journal entries then can be deleted, as discussed elsewhere herein.

Figure 6:
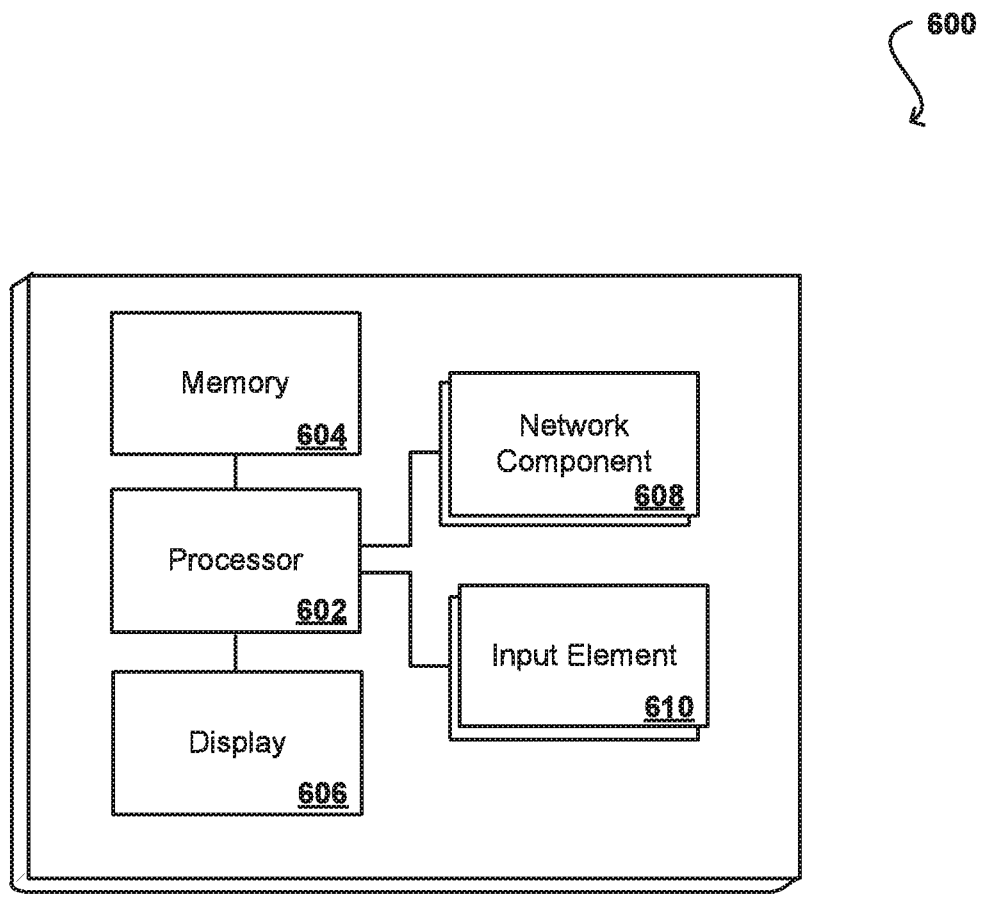
FIG. 6 illustrates example components of a computing device that can be utilized in accordance with various embodiments.

FIG. 6 illustrates a logical arrangement of a set of general components of an example computing device 600 that can be utilized in accordance with various embodiments. In this example, the device includes a processor 602 for executing instructions that can be stored in a memory subsystem or element 604. As would be apparent to one of ordinary skill in the art, the device can include many types of memory, data storage, or non-transitory computer-readable storage media, such as a first data storage for program instructions for execution by the processor 602, a separate storage for images or data, a removable memory for sharing information with other devices, etc. The device typically will include some type of display element 606, such as a touch screen or liquid crystal display (LCD), or set of LEDs, among other such. In some embodiments, the computing device 600 of FIG. 6 can include one or more communication elements 608, such as a Wi-Fi, Bluetooth, RF, wired, or wireless communication system. The device in many embodiments can communicate with a network, such as the Internet or an intranet, and may be able to communicate with other such devices. In some embodiments the device can include at least one additional input device 610 able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

As discussed above, the various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
    detecting a power restoration event on a host machine, the host machine including volatile memory for temporarily storing data undergoing at least one operation on the host machine;
    disabling access via a first channel to at least one memory page stored on non-volatile memory on a memory subsystem connected to the host machine, the non-volatile memory being connected to the host machine by the first channel and being connected to an application via a sideband channel;
    receiving a request from the application over the sideband channel to perform data recovery on data stored in the non-volatile memory;
    transferring the data to a memory location accessible to the application;
    receiving an indication from the application that data recovery is complete; and
    enabling access via the first channel to the at least one memory page stored on the non-volatile memory.

2. The computer-implemented method of claim 1, further comprising:
    encrypting data stored to the non-volatile memory on the memory subsystem using a key received over the sideband channel, the key stored in volatile memory on the memory subsystem.

3. The computer-implemented method of claim 2, wherein receiving a request from an application over a sideband channel to perform data recovery on data stored in the non-volatile memory, further comprises:
    receiving a copy of the key over the sideband channel from the application; and
    decrypting the data stored to the non-volatile memory using the copy of the key.

4. The computer-implemented method of claim 3, wherein decrypting the data stored to the non-volatile memory using the copy of the key, further comprises:
    verifying an identity of associated with the application.

5. The computer-implemented method of claim 1, further comprising:
    deleting at least one journal entry or at least one memory page from the non-volatile memory corresponding to the data undergoing at least one operation on the host machine.

6. The computer-implemented method of claim 1, wherein the data undergoing at least one operation on the host machine includes information about the at least one operation, wherein the application can use the data to determine the operation and cause the operation to resume after the power restoration event.

7. The computer-implemented method of claim 1, wherein the memory subsystem is a non-volatile in-line memory module (NV-DIMM).

8. A host machine, comprising:
    a processor;
    volatile memory for temporarily storing data;
    a power source for providing power to the processor and the volatile memory; and
    a memory subsystem connected to the processor and the volatile memory by at least one communication bus, the memory subsystem connected to an application by a sideband channel, the memory subsystem configured to receive power from the power source and further including an application-specific integrated circuit (ASIC), non-volatile memory, and at least one battery, the ASIC configured to:

detect a power restoration event on a host machine, the host machine including volatile memory for temporarily storing data undergoing at least one operation on the host machine;
disable access via the at least one communication bus to at least one memory page in the non-volatile memory on the memory subsystem;
receive a request from an application over the sideband channel to perform data recovery on data stored in the non-volatile memory;
transfer the data to a memory location accessible to the application;
receive an indication from the application that data recovery is complete; and
enable access via the at least one communication bus to the at least one memory page in the non-volatile memory on the memory subsystem.

9. The system of claim 8, wherein the ASIC is further configured to:
encrypt data stored to the non-volatile memory on the memory subsystem using a key received over the sideband channel, the key stored in volatile memory on the memory subsystem.

10. The system of claim 9, wherein to receive a request from an application over a sideband channel to perform data recovery on data stored in the non-volatile memory, the ASIC is further configured to:
receiving a copy of the key over the sideband channel from the application; and
decrypting the data stored to the non-volatile memory using the copy of the key.

11. The system of claim 10, wherein to decrypt the data stored to the non-volatile memory using the copy of the key, the ASIC is further configured to:
verify an identity of associated with the application.

12. The system of claim 8, wherein the ASIC is further configured to:
delete at least one journal entry or at least one memory page from the non-volatile memory corresponding to the data undergoing at least one operation on the host machine.

13. The system of claim 8, wherein the data undergoing at least one operation on the host machine includes information about the at least one operation, wherein the application can use the data to determine the operation and cause the operation to resume after the power restoration event.

14. The system of claim 8, wherein the memory subsystem is a non-volatile in-line memory module (NV-DIMM).

15. A memory card, comprising:
non-volatile memory;
a connector enabling the memory card to be connected to a connector of a host machine;
a sideband channel interface;
a secondary power source; and
circuitry connected to the non-volatile memory and configured to receive power from the secondary power source in response to a loss of power to the host machine, the circuitry configured to:
detect a power restoration event on a host machine, the host machine including volatile memory for temporarily storing data undergoing at least one operation on the host machine;
disable access via a primary interface to data stored in the non-volatile memory, the primary interface connecting a processor of the host machine to the non-volatile memory;
receive a request from an application over a sideband channel to perform data recovery on the data stored in the non-volatile memory;
transfer the data to a memory location accessible to the application;
receive an indication from the application that data recovery is complete; and
enable access via the primary interface to the data stored in the non-volatile memory on the memory subsystem.

16. The memory card of claim 15, wherein the circuitry is further configured to:
encrypt data stored to the non-volatile memory on the memory subsystem using a key received over the sideband channel, the key stored in volatile memory on the memory subsystem.

17. The memory card of claim 16, wherein to receive a request from an application over a sideband channel to perform data recovery on data stored in the non-volatile memory, the circuitry is further configured to:
receive a copy of the key over the sideband channel from the application; and
decrypt the data stored to the non-volatile memory using the copy of the key.

18. The memory card of claim 17, wherein to decrypt the data stored to the non-volatile memory using the copy of the key, the circuitry is further configured to:
verify an identity of associated with the application.

19. The memory card of claim 15, wherein the circuitry is further configured to:
delete at least one journal entry or at least one memory page from the non-volatile memory corresponding to the data undergoing at least one operation on the host machine.

20. The memory card of claim 15, wherein the data undergoing at least one operation on the host machine includes information about the at least one operation, wherein the application can use the data to determine the operation and cause the operation to resume after the power restoration event.

* * * * *